United States Patent
Davis et al.

(10) Patent No.: US 6,196,444 B1
(45) Date of Patent: Mar. 6, 2001

(54) METHOD AND APPARATUS FOR SOLDERING BALL GRID ARRAY MODULES TO SUBSTRATES

(75) Inventors: John Gillette Davis; Joseph Michael Kielbasa, both of Charlotte, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/280,467

(22) Filed: Mar. 30, 1999

Related U.S. Application Data

(62) Division of application No. 08/683,767, filed on Jul. 17, 1996, now Pat. No. 5,924,622.

(51) Int. Cl.$^7$ .................................................. B23K 31/02
(52) U.S. Cl. .................................... 228/180.22; 228/56.3; 228/248.1; 156/236
(58) Field of Search ........................... 228/180.22, 56.3, 228/246, 248.1; 156/236, 232; 257/737, 738; 438/613

(56) References Cited

U.S. PATENT DOCUMENTS

| | | | |
|---|---|---|---|
| 3,324,014 | * 6/1967 | Modjeska | 204/15 |
| 4,216,350 | * 8/1980 | Reid | 174/68.5 |
| 4,664,309 | 5/1987 | Allen et al. | |
| 4,705,205 | * 11/1987 | Allen et al. | 228/180.2 |
| 4,788,767 | 12/1988 | Desai et al. | |
| 4,842,184 | 6/1989 | Miller, Jr. | |
| 5,299,730 | 4/1994 | Pasch et al. | |
| 5,323,947 | 6/1994 | Juskey et al. | |

(List continued on next page.)

FOREIGN PATENT DOCUMENTS

| | | |
|---|---|---|
| 8-031830 | * 2/1996 | (JP) . |
| 11-240612 | * 9/1999 | (JP) . |
| 11-274199 | * 10/1999 | (JP) . |
| 11-274207 | * 10/1999 | (JP) . |

OTHER PUBLICATIONS

"Solder Preform Technique for Fine Pitch Surface Mount Technology Components," IBM Technical Disclosure Bulletin, vol. 36, No. 02, Feb., 1993.

"Flip Chips on Laminates: High Volume Assembly," Slesinger, K.A., Jan. 23, 1996.

*Primary Examiner*—Patrick Ryan
*Assistant Examiner*—Kiley Stoner
(74) *Attorney, Agent, or Firm*—William N. Hogg

(57) ABSTRACT

A method and device for attaching a module having a ball grid array or column grid array of solder material thereon arranged in a given pattern or footprint to a substrate having an array of connector pads arranged in the same pattern is provided. A preformed alignment device has an array of through holes therein aligned in the same pattern or footprint as the ball grid array or column pattern on the module and the pattern of contact pads on the substrate. The through holes in the preform are filled with a solder material which can be either a solder paste or a solid solder or with a curable conductive adhesive. The solder preferably is a lead-tin eutectic, but in any event has a melting point of less than about 240° C. and in the case of the conduction adhesive, will cure below about 240° C. The preform with the filled through holes is interposed between the module and the substrate with the material in the holes in contact with the solder balls or columns and the contact pads. Heat is applied to reflow the solder or cure the adhesive in the holes to join the module to the substrate. Depending upon the composition of the solder of the balls or columns, they might or might not melt. In the case of solid solder, thin films of flux material can be applied to opposite faces of the preform to prevent the solder from dislodging therefrom and to act as a flux when the solder is reflowed.

7 Claims, 1 Drawing Sheet

U.S. PATENT DOCUMENTS

| | | |
|---|---|---|
| 5,388,327 | 2/1995 | Trabucco . |
| 5,442,852 * | 8/1995 | Danner .................................. 29/843 |
| 5,482,736 * | 1/1996 | Glenn et al. ........................... 427/96 |
| 5,553,769 * | 9/1996 | Ellerson et al. .................. 228/123.1 |
| 5,593,080 * | 1/1997 | Teshima et al. ....................... 228/39 |
| 5,718,361 * | 2/1998 | Braun et al. ........................ 228/56.3 |
| 5,796,590 * | 8/1998 | Klein ..................................... 361/774 |
| 5,859,470 * | 1/1999 | Ellerson et al. ...................... 257/772 |
| 5,920,125 * | 7/1999 | Ellerson et al. ...................... 257/778 |
| 5,921,462 * | 7/1999 | Gordon ................................ 228/191 |
| 5,950,908 * | 9/1999 | Fujino et al. ...................... 228/248.1 |

* cited by examiner

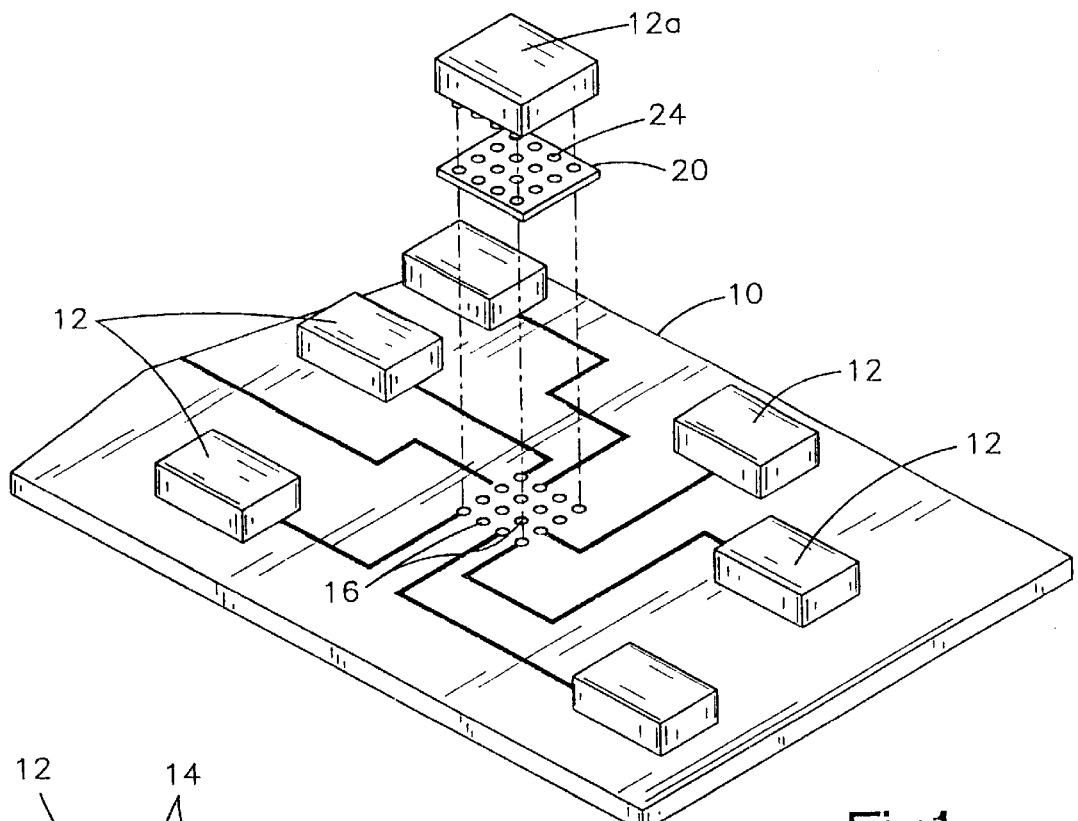
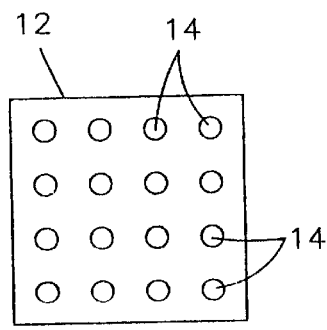
Fig.1A
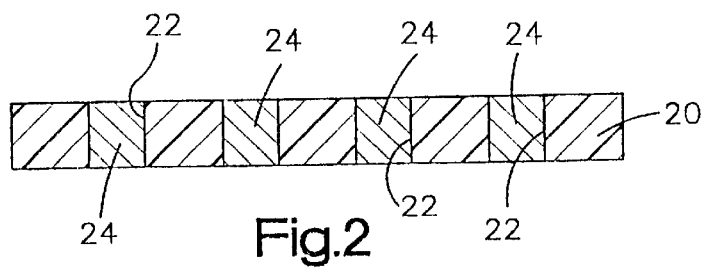
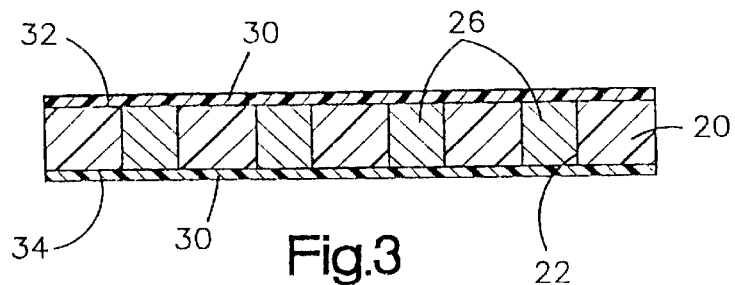

METHOD AND APPARATUS FOR SOLDERING BALL GRID ARRAY MODULES TO SUBSTRATES

RELATED APPLICATIONS

This application is a divisional of application Ser. No. 08/683,767, filed Jul. 17, 1996 now U.S. Pat. No. 5,,924,622.

FIELD OF THE INVENTION

This invention relates generally to a technique for attaching grid array modules to a substrate utilizing independent solder material.

BACKGROUND OF THE INVENTION

One common technique in the manufacturing of populated circuit cards or circuit boards is to mechanically and electrically connect various components such as I/C chip modules to attachment pads on a substrate, such as epoxy-impregnated fiberglass or polyimide, or other rigid material by flip chip bonding. In connecting the modules, a very common way is to provide a module with what is known as a ball grid array (BGA) of solder balls or column grid array, (CGA) of solder material. The balls or columns are arranged in a pre-determined pattern corresponding to the pattern of attachment pads on the substrate known as a footprint. The module is placed on the substrate with the solder balls or columns contacting the attachment pads. Typically solder paste or the like is applied to the attachment pads on the substrate. This will provide the flux required and also cause the solder balls or columns to adhesively adhere to the attachment pads thus maintaining alignment with the solder balls or columns during heating and reflow of the solder. Heat is then applied to reflow the solder to form a mechanical and electrical connection. In production, this technique works quite well in most instances.

However, sometimes reworking of the populated substrate is required in which a module which has been attached needs to be removed and replaced with another module. This entails melting the solder, removing the module, and cleaning the pads and the substrate. Solder paste then is applied to the pads, and another module is attached by contacting the solder balls or columns thereon with the solder paste and reflowing the solder. In such case of reworking, it is difficult to provide the proper amount of solder paste on each of the pads on the substrate to form the proper bond. It is also necessary to align the solder balls or columns on the module. This is a time-consuming operation and frequently needs several iterations.

Therefore, it is a principal object of the present invention to provide an improved technique for applying the proper amount of solder paste between the attachment pads on a substrate and the solder balls or columns on a grid array contact of module for joining the module to the substrate.

SUMMARY OF THE INVENTION

A method and device for attaching a module having a ball grid array or column grid array of solder material thereon arranged in a given pattern or footprint to a substrate having an array of connector pads arranged in the same pattern is provided. A preformed alignment device is provided having an array of through holes therein aligned in the same pattern or footprint as the ball grid array or column pattern on the module and the pattern of contact pads on the substrate. The through holes in the preform are filled with a solder material which can be either a solder paste or a solid solder. The solder preferably is a lead-tin eutectic, but in any event has a melting point of less than about 240° C. The preform with the solder-filled through holes is interposed between the module and the substrate with the solder in the holes in contact with the solder balls or columns and the contact pads. Heat is applied to reflow the solder in the holes to join the module to the substrate. Depending upon the composition of the solder of the balls or columns, they might or might not melt. In the case of solid solder, thin films of flux material can be applied to opposite faces of the preform to prevent the solder from dislodging therefrom and to act as a flux when the solder is reflowed.

BRIEF DESCRIPTION OF THE DRAWINGS

FIG. 1 is an exploded view of a portion of a circuit board showing the mounting of a ball grid array module thereon according to this invention;

FIG. 1A is a bottom plan view of a ball grid array module showing solder balls arranged thereon;

FIG. 2 is a longitudinal sectional view through a preform containing measured amounts of solder paste; and FIG. 3 is another embodiment of a preform containing metallic solder having films of flux holding the solder therein.

DESCRIPTION OF THE PREFERRED EMBODIMENT(S)

Referring now to the drawings and for the present to FIG. 1, a substrate in the form of a circuit board 10 is shown which has a plurality of ball grid array (BGA) modules 12 mounted thereon. (It is to be understood that a grid array need not be of one regular shape, such as square or rectangular.) FIG. 1A shows a bottom plan view of a BGA module which has a plurality of solder balls 14 arranged in a pattern known as a footprint. The solder balls 14 are mounted in a conventional manner to mounting pads or contact pads 16 formed on the circuit board 10 in the same pattern as the footprint of the solder balls 14.

There are several different types of ball grid array modules: e.g., ceramic ball grid array (CBGA), plastic ball grid array (PBGA), and tape ball grid away (TBGA) . These refer to the material on which the balls are mounted. There are similar grid arrays known as ceramic column grid arrays (CCGA) wherein the solder is in the form of columns rather than balls. Any or all of these may be attached to a substrate, and they will be referred to collectively as grid arrays: i.e., grid array is intended to include any module that has some form of solder acting as a stand off and attaching the module to a substrate. The following description relates to ball grid arrays but the invention is equally applicable to other grid array modules.

As shown in FIG. 1, there are several BGA modules 12 secured to the circuit board 10. However, one BGA module has been removed for rework, exposing the mounting pads 16 thereon to which it was attached, and a new BGA module 12a is shown ready to be attached according to the present invention. The new module 12a has the same configuration , i.e. it has the same footprint or pattern of solder balls 14 as the BGA module that was removed which footprint matches the pattern of mounting pads 16 on the substrate 10 to which it is to be attached. Moreover, the pads 16 to which the module 12a is to be attached and area on the substrate 10 surrounding these pads are cleaned and ready to receive the module 12a.

According to the present invention, in order to provide a precise measured amount of solder in the locations required to attach the BGA module to the substrate, a preform alignment device 20 as show in FIGS. 1 and 2 is provided having a group of through holes 22 provided therein arranged in the same pattern as the pattern of the solder balls 14 and the mounting pads 16. Since the module 12 already has solder balls 14 which act as a stand-off when the module is attached, only a small amount of solder is required to reflow to form a bond between the balls 14 and contacts 16. The desired solder paste 24 is provided in the through holes 22. The solder paste contains both solder and flux. The solder in the preform must have a melting point below about 240° C., since populated circuit boards or cards normally cannot withstand temperatures higher than this. Thus the preferred solder is eutectic lead-tin (63% Pb/37% Sn) which has a melting point of 183° C. The thickness of the preform 20 and the size of the holes 22 are selected such that each of the through holes 22 contains the required amount of solder paste 24. Typically for attaching a CBGA module to a circuit card, this thickness will be about 0.008 inches and the holes will be about 0.034 inches in diameter. These dimensions will vary from module type to module type and grid array type to grid array type.

In order to secure the new module 12a to the circuit board 10, the preform 20 with the solder paste therein is positioned over substrate 10 with the solder paste 24 in the holes 22 in contact with the mounting pads 16 on the circuit board 10. The module 12a is positioned against the preform with the solder balls 14 in contact with the solder paste 24 in the through holes 22. Since the solder paste is normally tacky this tackiness will hold the module in place on the preform and the preform in place on the substrate. The assembly is then heated sufficiently to reflow the solder in the solder paste 24 to form a solder joint between the module 12a and the circuit board 10. As explained above this temperature is below about 240° C.

The preform 20 can be formed of any one of several different materials. For example, if it is desired to remove the preform after the joining operation, a material which is soluble in, or at least removable by a selected solvent can be used. For example, a preform formed of polyvinyl alcohol can be used which is water soluble. Hence following the joining operation the preform can be removed merely by washing with water. Alternatively, if it is desired to leave the preform in place after the soldering, the preform 20 can be made of a material that will permanently remain, such as an epoxy-filled fiberglass known as FR4.

In either case, the particular solder paste selected is not critical other than that the solder in the paste have a melting point below about 240° C. For example, solder paste known as R244 manufactured by Kester Company Containing Pb/Sn eutectic is well suited. This paste is known as "no clean" paste, meaning that no post cleaning operation, i.e., after soldering, is required. Of course, other pastes could be used.

Depending upon the composition of the solder of the solder balls 16, they may or may not reflow during the joining operation. For example, a common solder used in certain grid arrays is 95% Pb-5% Sn which has a melting point of about 300° C. which does not melt during reflow of the solder in the paste 24. However, it is not necessary for the solder balls 14 to melt since the melting of the solder in the solder paste 24 will reflow and bond the solder balls 14 to the pads 16. Moreover, the solder balls 14, whether or not they reflow will serve as the stand-off for this module.

Alternatively, a curable conductive adhesive may be employed in the holes 22 and used for this joining operation.

This adhesive must cure below 240° C. Suitable conductive adhesive sold by AI Technology, Inc. of Lawrenceville, N.J. under the trade name LZTP, a thermoplastic conductive paste, and LZSP 8415 and LZSP 8155, both of which are epoxies. These pastes cure at temperatures ranging from about 150° C. to about 200° C.

Referring now to FIG. 3, a modified form of the preform 20 is shown. In this embodiment, rather than solder paste being disposed in the through holes, solid metallic solder 26 is disposed in the through holes 22. In order to ensure that the solder remains therein and to provide flux during solder reflow, thin films of flux material 30 are coated onto the opposite faces 32 and 34 of the preform 20. This flux can be the same flux that is used in the R244 solder paste. While such films 30 can also be used with the preform when solder paste 24 is used, since the paste contains flux, and the paste itself normally is adherent or adhesive enough, such films are not normally required. In any event, if such films 30 are required, they can be deposited on the opposite faces 32 and 34 of the preform 20. When the preform 20 is ready for use for soldering the modules, the preform is placed in position and the assembly is heated to cause the solder in the preform to reflow causing a solder bond to be formed.

Accordingly, the preferred embodiments of the present invention have been described. With the foregoing description in mind, however, it is understood that this description is made only by way of example, that the invention is not limited to the particular embodiments described herein, and that various rearrangements, modifications, and substitutions may be implemented without departing from the true spirit of the invention as hereinafter claimed.

What is claimed is:

1. A method of attaching a module having an array of solder balls or columns thereon arranged in a given pattern to a substrate having an array of attachment pads arranged in the same given pattern as said array of solder balls or columns, comprising the steps of:

providing a preform having an array of through holes therein extending from one face thereof to an opposing face and arranged in said given pattern;

filling said holes with solder material having a melting point of less than about 240° C.;

interposing said preform between said module and said substrate with said solder in the holes in contact with said solder balls or columns and said attachment pads;

and reflowing said solder while in said preform to join said module to said substrate.

2. A method of attaching a module having an array of solder balls or columns thereon arranged in a given pattern to a substrate having an array of attachment pads arranged in the same given pattern as said array of solder balls or columns, comprising the steps of:

providing a preform having an array of through holes therein extending from one face thereof to an opposing face and arranged in said given pattern:

filling said holes with solder material having a melting point of less than about 240° C.;

interposing said preform between said module and said substrate with said solder in the holes in contact with said solder balls or columns and said attachment pads;

and reflowing said solder while in said preform to join said module to said substrate; and further characterized by removing said preform after the reflow step.

3. The invention as defined in claim 2 wherein said preform is a material which can be removed by a solvent, and said preform is removed by contacting said preform with said solvent.

4. The invention as defined in claim 3 wherein said solvent is water.

5. The invention as defined in claim 1 wherein said solder in each hole is in the form of a solid mass of solder material.

6. The invention as defined in claim 1 wherein said solder in each hole is in the form of a solder paste.

7. The inventions as defined in claim 5 wherein a film of flux is coated on said faces of the preform.

* * * * *